United States Patent
Lee (10) Patent No.: US 9,935,610 B2
(45) Date of Patent: Apr. 3, 2018

(54) ACOUSTIC WAVE DEVICE

(71) Applicant: WISOL CO., LTD., Osan-si, Gyeonggi-do (KR)

(72) Inventor: Hunyong Lee, Hwaseong-si (KR)

(73) Assignee: WISOL CO., LTD., Gyeonggi-Do (KR)

( * ) Notice: Subject to any disclaimer, the term of this patent is extended or adjusted under 35 U.S.C. 154(b) by 552 days.

(21) Appl. No.: 14/601,322

(22) Filed: Jan. 21, 2015

(65) Prior Publication Data

US 2016/0204762 A1   Jul. 14, 2016

(30) Foreign Application Priority Data

Jan. 13, 2015   (KR) .......................... 10-2015-0006437

(51) Int. Cl.
  *H03H 9/25*   (2006.01)
  *H03H 9/02*   (2006.01)
  *H03H 9/10*   (2006.01)

(52) U.S. Cl.
  CPC .......... *H03H 9/25* (2013.01); *H03H 9/02897* (2013.01); *H03H 9/1078* (2013.01); *H01L 2224/11* (2013.01)

(58) Field of Classification Search
  CPC .... H03H 9/25; H03H 9/02897; H03H 9/1078; H03H 9/107
  USPC .... 310/310 A–313 D, 313 R, 340, 344, 348; 333/193, 196
  See application file for complete search history.

(56) References Cited

U.S. PATENT DOCUMENTS

| 7,427,824 B2* | 9/2008 | Iwamoto | H03H 9/0576 310/313 R |
|---|---|---|---|
| 8,436,514 B2 | 5/2013 | Fukano et al. | |
| 9,124,239 B2* | 9/2015 | Nakayama | H03H 9/0057 |
| 2007/0252481 A1* | 11/2007 | Iwamoto | H03H 9/0576 310/344 |
| 2014/0125197 A1* | 5/2014 | Fujita | H01L 41/0477 310/313 B |

(Continued)

FOREIGN PATENT DOCUMENTS

JP   2010-056671 A   3/2010
JP   2012119928 A   6/2012

(Continued)

OTHER PUBLICATIONS

KIPO Office Action for Korean Application No. 10-2015-0006437 which corresponds to the above-referenced U.S. application.
(Continued)

*Primary Examiner* — Thomas Dougherty
(74) *Attorney, Agent, or Firm* — LRK Patent Law Firm (57) ABSTRACT

The present invention relates to an acoustic wave device including: a substrate; an IDT arranged on the substrate; a connection electrode arranged on the substrate and electrically connected to the IDT; a side wall formed outside the IDT to create a cavity including the IDT on the substrate; a cover formed on a top of the side wall; a connection terminal penetrating the side wall or the cover or formed along an inner or outer peripheral surface of the side wall, and electrically connected to the connection electrode; and a conductive layer formed on a top of the cover not to be overlapped with the connection terminal, in which an area of the conductive layer is less than 50% of an area of the cover.

12 Claims, 4 Drawing Sheets

(56) References Cited

U.S. PATENT DOCUMENTS

2014/0191617 A1* 7/2014 Ohashi ................ H03H 9/1092
310/348

FOREIGN PATENT DOCUMENTS

| JP | 2013-135264 A | 7/2013 |
| JP | 5521417 B2 | 6/2014 |
| KR | 1020140112511 A | 9/2014 |
| WO | 2006/134928 A1 | 12/2006 |
| WO | 2007/052598 A1 | 5/2007 |
| WO | 2009/057699 A1 | 5/2009 |
| WO | 2009/075088 A1 | 6/2009 |
| WO | 2011/136070 A1 | 11/2011 |

OTHER PUBLICATIONS

KIPO Office Action for Korean Application No. 10-2015-0006437 dated Jan. 31, 2017, which corresponds to the above-referenced U.S. application.

* cited by examiner

ACOUSTIC WAVE DEVICE

BACKGROUND OF THE INVENTION

Field of the Invention

The present invention relates to an acoustic wave device, and more specifically, to an acoustic wave device which can guarantee a pressure resistance characteristic and improve reliability.

Background of the Related Art

A Wafer Level Package (WLP) process may manufacture a package as a complete product at a wafer level, i.e., while individual chips are not isolated from a wafer. Existing facilities and processes may be used as they are in a manufacturing facility and a manufacturing process used for manufacturing the package. Since such a WLP process proceeds a packaging process in a wafer state, hundreds and thousands of packages can be produced in a single packaging process, and thus manufacturing cost can be greatly reduced compared with an existing method which proceeds the packaging process by the unit of individual chips.

Recently, the wafer level packaging technique described above is also applied to fabricate a small and thin surface acoustic wave (SAW) filter. Since a SAW filter package operates as a filter by arranging an IDT in a cavity created by a substrate, a side wall and a cover and using mechanical vibration of the IDT, the cavity should be perfectly protected. However, the process of manufacturing an electronic device including a SAW filter produced in the WLP method has a problem particularly incapable of sufficiently enduring the high pressure of a transfer molding process.

Although the side wall and the cover are formed using a strong material the same as that of the substrate in some cases in order to improve the problem, there is a problem of high manufacturing cost and low throughput.

Figure 1:
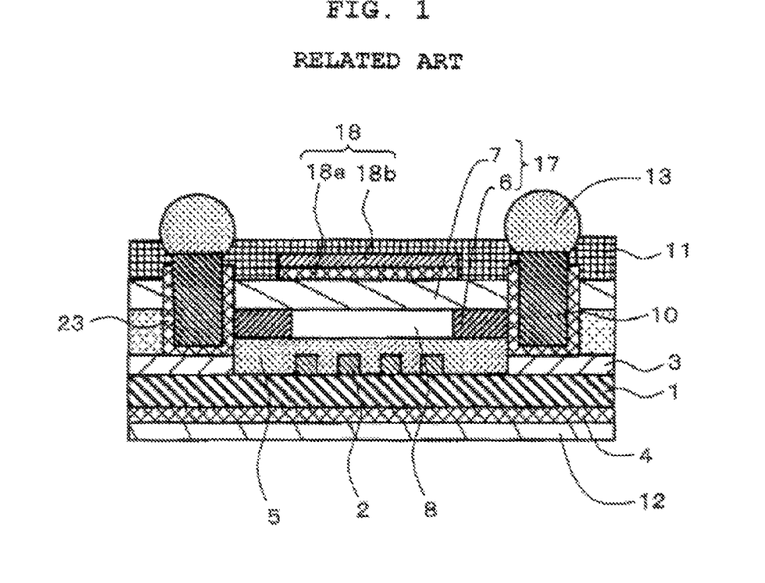
FIG. 1 is a cross-sectional view showing a conventional acoustic wave device.
Figure 2:
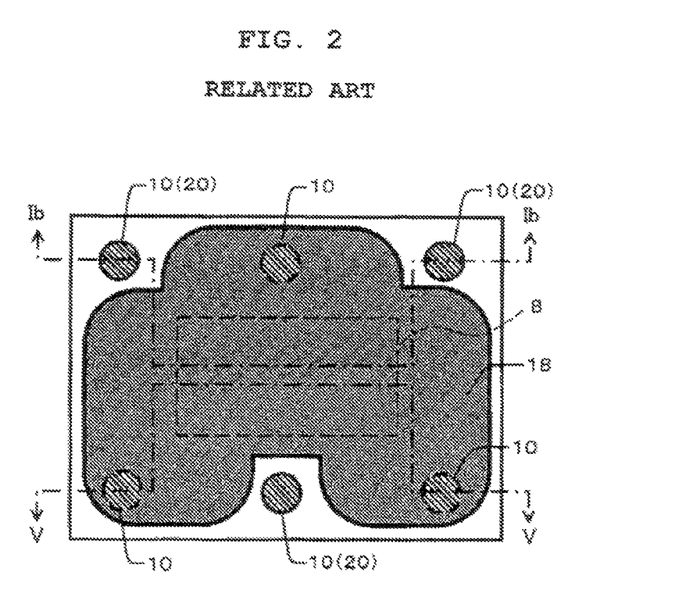
FIG. 2 is a plan view showing a conventional acoustic wave device.

U.S. Pat. No. 8,436,514 described below is for improving the problems described above, and FIG. 1 is the representative figure of the prior art and a cross-sectional view showing the structure described in the prior art, and FIG. 2 is FIG. 1A of the prior art, which is a plan view showing the structure described in the prior art. The prior art describes to endure the pressure of the transfer molding process by adding a conductive layer (18 of FIG. 1) on a protective cover (7 of FIG. 1). Particularly, referring to FIG. 2, the prior art describes to effectively endure the pressure by forming the conductive layer wide on the top surface of an acoustic wave device, and claim 13 of the prior art specifies to form an area of the conductive layer as wide as more than 50% of the area of the top surface of the acoustic wave device.

However, the method of the prior art generates another problem. When the conductive layer is formed wide on the top of the protective cover, a phenomenon (warpage) of bending the substrate of the acoustic wave device occurs. When the substrate is formed thick to prevent such a phenomenon, it is moving against the trend of thinning the acoustic wave device, and when the substrate is ground after the WLP is performed on the thick substrate, manufacturing cost increases and throughput is lowered due to additional processes.

When an acoustic wave device is formed, a single crystal material such as LiTa2O3 is frequently used as a substrate, and such a material is disadvantageous in that it is easily broken by a physical shock applied from outside. Accordingly, it should be handled with care in the manufacturing process. More problems are raised as bending the substrate increases.

For example, when a laminating process or a coating process is applied to form an insulation cover layer after forming a conductive layer, the substrate is put on a vacuum chuck and flattened using vacuum. However, there is a problem in that a substrate with the warpage described above is easily broken in this process or a material for forming the insulation cover layer is not uniformly applied on the substrate. Furthermore, even in a process of separating (sawing) a plurality of acoustic wave devices manufactured in a state of a wafer in the WLP manufacturing process into individual acoustic wave devices, a problem of easily breaking the substrate occurs.

SUMMARY OF THE INVENTION

Therefore, the present invention has been made in view of the above problems, and it is an object of the present invention to improve the pressure resistance characteristic of an acoustic wave device manufactured in a WLP method.

At the same time, another object of the present invention is to enhance throughput of a process and improve reliability of a substrate by preventing warpage of the substrate.

In addition, another object of the present invention is to provide a small and thin acoustic wave device manufactured in a WLP method and enhance durability of the acoustic wave device.

To accomplish the above objects, according to one aspect of the present invention, there is provided an acoustic wave device including: a substrate; an IDT arranged on the substrate; a connection electrode arranged on the substrate and electrically connected to the IDT; a side wall formed outside the IDT to create a cavity including the IDT on the substrate; a cover formed on a top of the side wall; a connection terminal penetrating the side wall or the cover or formed along an inner or outer peripheral surface of the side wall, and electrically connected to the connection electrode; and a conductive layer formed on a top of the cover not to be overlapped with the connection terminal, in which an area of the conductive layer is less than 50% of an area of the cover.

In another embodiment of the present invention, the conductive layer may include a plurality of conductive members, and a total sum of the areas of the conductive members may be less than 50% of the area of the cover, and, specifically, the area of a conductive member may be less than 20% of the area of the cover. On the other hand, in another embodiment of the present invention, a space between the plurality of conductive members or a space between the connection terminal and an adjacent conductive member may be smaller than 60 um.

In the acoustic wave device according to another embodiment of the present invention, the conductive layer may include a plurality of conductive members, and an area of the conductive member may be (a thermal expansion coefficient of the conductive member/a thermal expansion coefficient of the cover) times an area of the cover. At this point, the thermal expansion coefficient of the cover may be three to six times the thermal expansion coefficient of the conductive layer.

In another embodiment of the present invention, the connection terminal may include at least one or more signal terminals and at least two or more ground terminals, and at least two or more of the plurality of ground terminals may be electrically connected to each other. At this point, a metal line for electrically connecting the at least two or more ground terminals may be formed on the top of the cover, and in this case, a space between the plurality of conductive members, a space between the connection terminal and an adjacent conductive member, or a space between the metal line and an adjacent conductive member may be smaller than 60 um.

In another embodiment of the present invention, thickness of the conductive layer may be 15 to 50 um, and the conductive layer and the connection terminal may be electrically isolated, and the acoustic wave device may further include a protection layer for covering the side wall, the cover and the conductive layer.

DETAILED DESCRIPTION OF THE PREFERRED EMBODIMENT

An acoustic wave device according to the present invention will be hereafter described in detail with reference to the accompanying drawings. The disclosed embodiments are provided to enable those skilled in the art to easily understand the scope of the present invention, and the present invention is not limited by such embodiments. Moreover, matters illustrated in the drawings are schematized in order to describe or explain the embodiments of the present invention more easily, and hence, may be different from actually embodied forms.

Meanwhile, the expression of 'including' an element is an expression of an 'open type' which merely refers to existence of a corresponding component, and it should not be construed as precluding additional components.

In addition, an expression such as "a first or a second" or the like is an expression for distinguishing a plurality of configurations and does not limit the order or other characteristics among the configurations.

Figure 3:
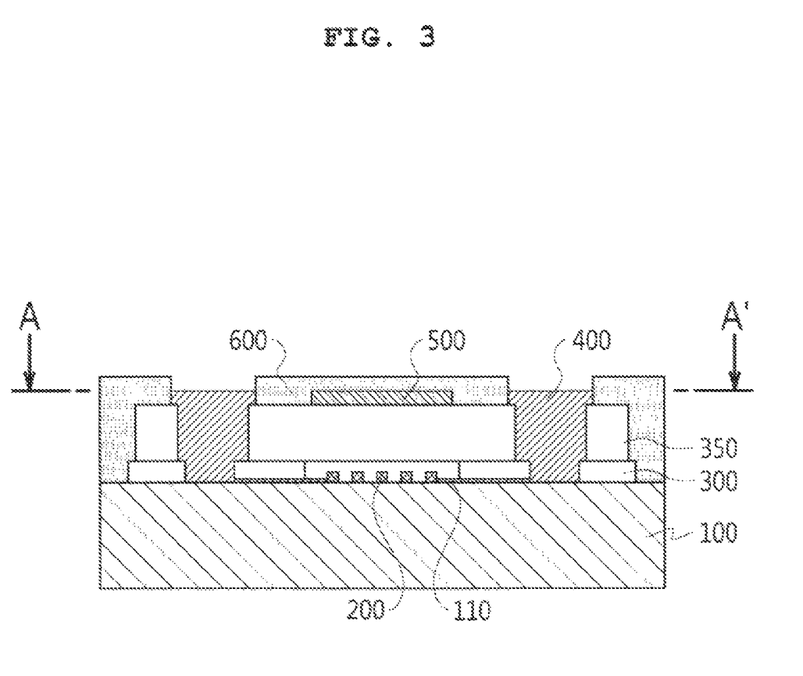
FIG. 3 is a cross-sectional view showing an acoustic wave device according to an embodiment of the present invention.
Figure 4:
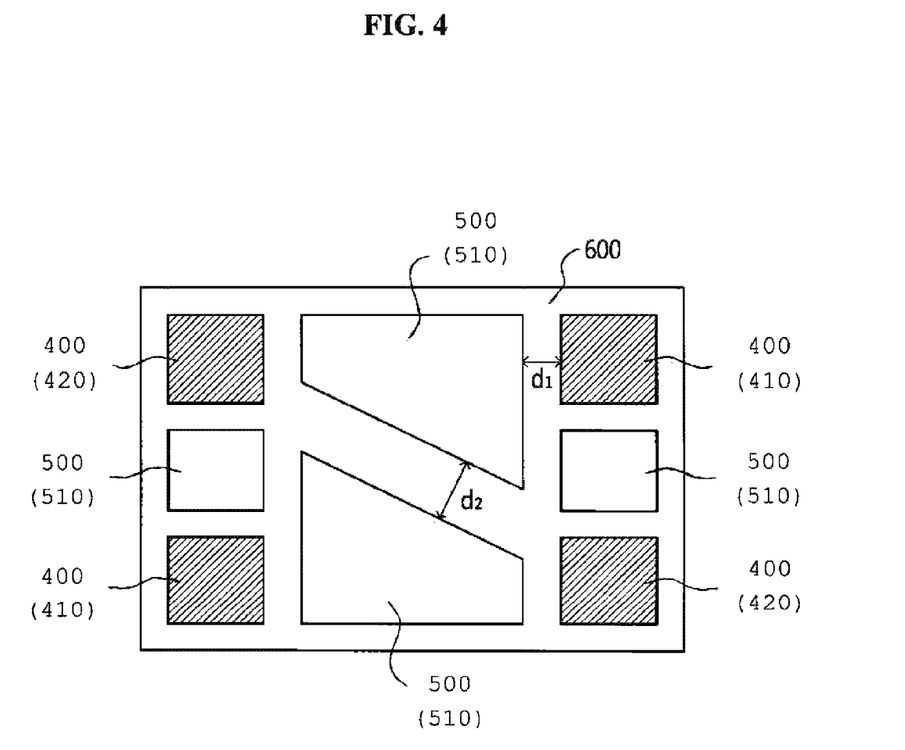
FIGS. 4 and 5 are plan views showing an acoustic wave device according to an embodiment of the present invention.
Figure 5:
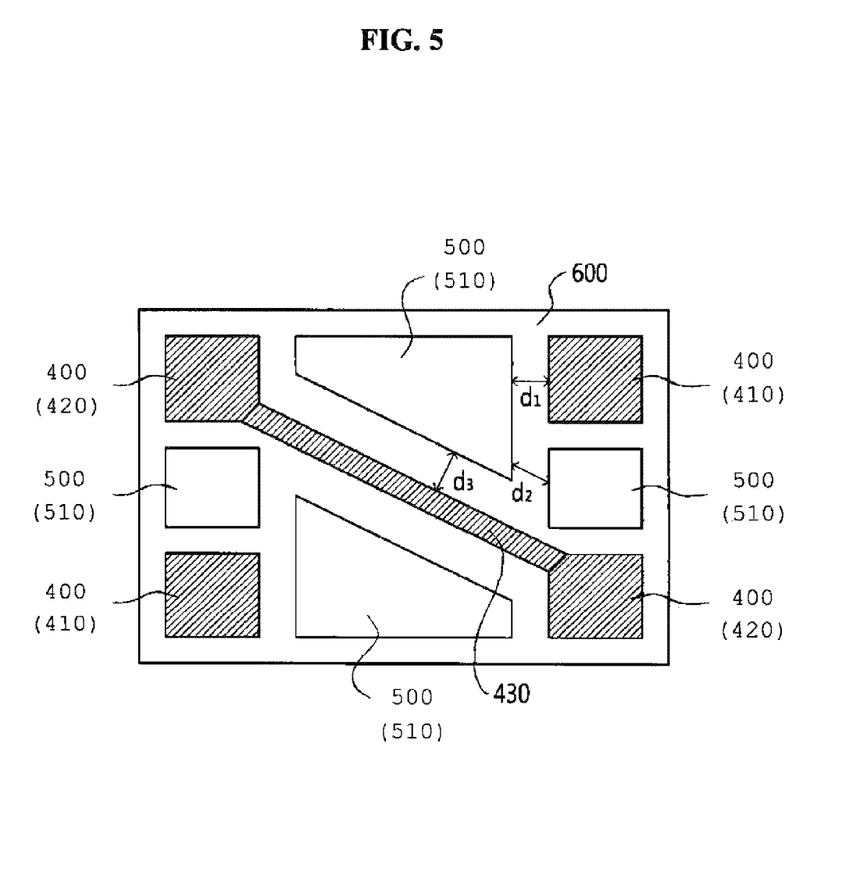

FIG. 3 is a cross-sectional view showing an acoustic wave device according to an embodiment of the present invention. In addition, FIGS. 4 and 5 are plan views showing an acoustic wave device according to a variety of embodiments of the present invention, which can be seen when the cross-sectional view of FIG. 3 is taken along the line A-A.

An acoustic wave device according to this embodiment includes a substrate 100, an IDT 200 arranged on the substrate 100, a connection electrode 110 arranged on the substrate 100 and electrically connected to the IDT 200, a side wall 300 formed outside the IDT 200 to create a cavity including the IDT 200 on the substrate 100, a cover 350 formed on the top of the side wall 300, a connection terminal 400 penetrating the side wall 300 or the cover 350 or formed along the inner or outer peripheral surface of the side wall 300, and electrically connected to the connection electrode 110, and a conductive layer 500 formed on the top of the cover 350 not to be overlapped with the connection terminal 400.

The substrate 100 is a configuration for supporting the configuration of the IDT 200 of the piezo electric element device. For example, a piezoelectric substrate may be used as the IDT 200. More specifically, a piezoelectric substrate configured of $LiTa_2O_3$, $LiNbO_3$ or the like can be used. The substrate 100 may be formed thin to form a small and thin acoustic wave device. In an embodiment of the present invention, the substrate 100 is formed to have a thickness of 250 um or less. In a method of the prior art, the substrate cannot be formed to have a thickness as described above due to the problems mentioned in the [background of the related art]. However, in the present invention, it is possible to manufacture an acoustic wave device according to the WLP to have a thickness as described above owing to the characteristic configurations contrasted to the technique of the prior art. Details thereof will be described below.

The InterDigital Transducer (IDT) 200 is a configuration included in the acoustic wave device. The acoustic wave device may operate as a filter according to mechanical vibrations of the IDT. The IDT 200 may be arranged on the substrate 100.

The connection electrode 110 is a configuration working as a medium for electrically connecting the IDT 200 to outside of the acoustic wave device. The connection electrode 110 electrically connects the connection terminal 400 and the IDT 200 formed inside the acoustic wave device and may transmit a signal input from an external terminal to the IDT 200 through the connection terminal 400 and the connection electrode 110 and also transmit a signal generated by the IDT 200 to a configuration external to the acoustic wave device, e.g., another configuration in an electronic device in which the acoustic wave device is mounted, through the medium of the connection electrode 110 and the connection terminal 400. Meanwhile, the connection electrode 110 and the connection terminal 400 may be formed in one piece, and it is possible to omit the connection electrode 110 of FIG. 3 and directly connect the IDT 200 to the connection terminal 400 according to the shape and arrangement of the IDT 200. In this case, a connection part of the connection terminal 400 connected to the IDT 200 should be regarded as the connection electrode 110. It is since that the connection electrode 110 and the connection terminal 400 are formed in one piece. Particularly, since the connection electrode 110 and the connection terminal 400 can be formed in a single process in a structure in which the connection electrode 110 and the connection terminal 400 are formed in one piece, the process can be reduced compared with a structure in which the connection electrode 110 and the connection terminal 400 are formed individually, and manufacturing cost can be saved as a result.

The side wall 300 and the cover 350 are structures for accommodating the IDT 200 described above inside the acoustic wave device. They can be formed of photosensitive resin or the like. The side wall 300 is formed outside the IDT 200 to surround the IDT 200, and the cover 350 is formed on the top of the substrate 100 on which the side wall 300 and the IDT 200 are arranged, and thus a cavity is formed by the substrate 100, the side wall 300 and the cover 350, and the IDT 200 is arranged inside the cavity. In an embodiment of the present invention, the side wall 300 and the cover 350 may be formed of the same photosensitive resin. Therefore, since both the side wall 300 and the cover 350 may be formed in a single process, the manufacturing process can be simplified, and although the cover 350 is formed after the side wall 300 is formed, since the same process is repeated using the same material, the manufacturing cost can be reduced. The side wall 300 and the cover 350 may be formed, for example, by exposing or developing the photosensitive resin.

The connection terminal 400 is a configuration for electrically connecting the IDT 200 to outside of the acoustic wave device. The connection terminal 400 includes a signal terminal 410 for transmitting and receiving signals to and from the IDT 200 and a ground terminal 420 for providing ground potential to the IDT 200. The connection terminal 400 may be electrically connected to the IDT 200 through the connection electrode 110 described above. The connection terminal 400 and the connection electrode 100 may be formed in one piece. The connection terminal 400 is a configuration working as a medium for electrically connecting other configurations of an electronic device on which the acoustic wave device is mounted to the acoustic wave device.

In the example shown in FIG. 3, the connection terminal 400 is formed to penetrate the side wall 300 and the cover 350. However, this is only an example, and the connection terminal 400 may be formed along the inner or outer peripheral surface of the side wall 300. In addition, only the cover 350 or the side wall 300 may penetrate according to relative positions of the side wall 300 and the cover 350. However, it is preferable to form the connection terminal 400 in a shape penetrating the side wall 300 or the cover 350 as shown in FIG. 3 to prevent flow of noise into the connection terminal 400 or generation of unnecessary short circuit. The connection terminal 400 may be formed of Ti, Cu, Sn, Ni, Au, an alloy of these or the like. Considering the electrical conduction characteristic, manufacturing cost or the like, the connection terminal 400 is preferably formed of Cu to improve performance, and considering a process of mounting the acoustic wave device later on an electronic device (e.g., a soldering process), the connection terminal 400 is preferably formed of Sn.

The conductive layer 500 is a configuration formed on the top of the acoustic wave device, specifically, on the top of the cover 350, to improve pressure resistance performance of the acoustic wave device. The conductive layer 500 may be formed of a metallic material, e.g., Cu, Sn or the like. The conductive layer 500 may be formed of a material the same as that of the connection terminal 400. In addition, the process of forming the connection terminal 400 and the process of forming the conductive layer 500 may be simultaneously progressed. As a result, a process of forming the conductive layer 500 does not need to be added in manufacturing the acoustic wave device. Meanwhile, although it is not shown in the figure, even when a patterning process should be progressed to form an inductor or a capacitor needed for operation of the acoustic wave device, the patterning process may be performed together with the process of forming the conductive layer 500, and thus processing efficiency can be improved.

In the present invention, the conductive layer 500 is formed to be isolated from and not to be overlapped with the connection terminal 400. That is, the conductive layer 500 is independently formed on the cover 350 without being connected to the connection terminal 400. This is a feature contrasting to the prior art. Referring to FIG. 2, it can be confirmed that the conductive layer 18 is connected to the connection terminal 400 (input/output use electrodes 10 and 20) in the prior art. It can be confirmed in the plan view of FIG. 2 that the conductive layer 18 and the input/output use electrodes (corresponding to the connection terminal of the present invention) are connected to each other. On the other hand, referring to FIG. 1, since the input/output use electrodes are formed in the shape of a pillar stretching toward the substrate 100 along the wall 23, the conductive layer is fixed to the wall through the medium of the input/output use electrodes. If one conductive layer is formed to occupy most of the area of a package as specified in the prior art, a problem of greatly bending the substrate 100 occurs when a strong pressure is applied. If the substrate 100 is bent, a problem of easily breaking the substrate 100 occurs in the following processes.

In the present invention, the conductive layer 500 is isolated from and not overlapped with the connection terminal 400 on the top of the cover 350 in order to improve such problems, and the conductive layer 500 is formed by using a plurality of conductive members 510 which will be described below in detail.

Meanwhile, the acoustic wave device of the present invention is formed to have an area of the conductive layer 500 less than 50% of the area of the cover 350. When the area of the conductive layer 500 is formed close to the cross-sectional area of the acoustic wave device, warpage of the substrate 100 or a problem of breaking the substrate of the acoustic wave device occurs in the process of mounting the acoustic wave device inside an electronic device.

However, when the area of the conductive layers 500 is less than 50% of the area of the cover 350 as shown in the present invention, the warpage of the substrate 100 occurring in the structure of the prior art can be prevented, and, in addition, a strong pressure generated by a variety of factors including the transfer molding process can be endured. Therefore, the cavity can be maintained in the acoustic wave device, and the IDT 200 can be protected. As a result, throughput and reliability of a product can be improved, and the product can be manufactured to be small and thin since thickness of the substrate 100 can be sufficiently reduced.

Hereinafter, various embodiments of the present invention will be described with reference to FIG. 4. FIG. 4 is a plan view showing an acoustic wave device according to an embodiment of the present invention.

In this embodiment, the conductive layer 500 includes a plurality of conductive members 510, and a total sum of the areas of the conductive members 510 is set to be less than 50% of the area of the cover 350. Four signal terminals 410 and four conductive members 510 are included in FIG. 4. However, this is only an example, and the number of connection terminals 400 may vary according to the function of the IDT 200, inputs and outputs included in the IDT 200 and the number of ground terminals 420, and the number, a size and arrangement of the conductive members 510 may be determined according to the design of the acoustic wave device within a range satisfying the condition described above.

As is confirmed from the plan view of FIG. 4, since a total sum of the areas of the plurality of conductive members 510 is set to be less than 50% of the area of the cover 350, characteristics of the structure of the conductive layer 500 mentioned above and effects according thereto can be demonstrated.

Meanwhile, in an embodiment of the present invention, the area of a conductive member 510 is set to be less than 20% of the area of the cover 350. In this embodiment, the total sum of the areas of the conductive members 510 is set to be less than 50% of the area of the cover 350, and, at the same time, the area of an individual conductive member 510 is set to be less than 20% of the area of the cover 350. Even when the size of the conductive member 510 increases, as well as when the size of the conductive layer 500 increases, the problem mentioned in the prior art or included in the structure of the prior art may occur. Accordingly, in this embodiment, the pressure resistance characteristic can be demonstrated further effectively by limiting the areas of the individual conductive members 510.

In another embodiment of the present invention, a space between a plurality of conductive members 510 or a space between the connection terminal 400 and an adjacent conductive member 510 is set to be smaller than 60 um. The element shown by the dashed line in FIG. 5 is the IDT 200 mounted on the substrate 100. The space between the conductive members 510 formed on the cover 350 and the space between the connection terminal 400 and the conductive member 510 are limited in the present invention. This is a limitation considering the difference among the materials forming the substrate 100, the cover 350 and the conductive members 510. The characteristics of modifying the substrate 100, the cover 350 and the conductive members 510 when a pressure or a temperature is applied are different from each other. Accordingly, the conductive member 510 and the connection terminal 400 need to be formed considering the difference of the characteristics.

When the space between the conductive members 510 or the space between the connection terminal 400 and an adjacent conductive member 510 is excessively large on the cover 350, the pressure applied to the acoustic wave device may be concentrated on the cover 350 existing between the spaces. That is, an excessively large force may be applied to a portion vulnerable to pressure in the acoustic wave device. In this case, the pressure resistance characteristic of the acoustic wave device is lowered.

Accordingly, in the present invention, the conductive members 510 need to be arranged so as to efficiently distribute the pressure applied to the acoustic wave device. In the present invention, the space between the plurality of conductive members 510 or the space between the connection terminal 400 and an adjacent conductive member 510 is set to be smaller than 60 um. At the same time, a total sum of the areas of the plurality of conductive members 510 is set to be less than 50% of the area of the cover 350. In such a structure, the objects of the present invention can be accomplished by distributing the pressure by the conductive members 510.

The largest one among the spaces between the conductive members 510 is $d_2$, and the largest one among the spaces between the conductive members 510 and the connection terminals 400 is $d_1$. In the present invention, $d_1$ and $d_2$ are set to be smaller than 60 um. That is, the conductive members 510 are densely arranged on the top of the cover 350 while they are not excessively spaced apart from each other. Accordingly, the pressure can be uniformly distributed, and the pressure resistance characteristic can be improved, and, at the same time, warpage of the substrate 100 can also be prevented.

In another embodiment of the present invention, the conductive layer 500 includes a plurality of conductive members 510, and the area of the conductive member 510 is set to be smaller than (thermal expansion coefficient of the conductive member 510/thermal expansion coefficient of the cover 350) times the area of the cover 350. This is an embodiment limiting the area of the conductive members 510 arranged on the top of the cover 350 considering thermal expansion coefficients of the conductive members 510, the cover 350 and the substrate 100.

When the conductive members 510 are formed in a wide area on the top of the cover 350, although the pressure resistance characteristic is improved, a problem of bending the substrate 100 occurs (it is a problem of the structure of the prior art). Such a problem occurs particularly due to the difference between the thermal expansion coefficients of the conductive member 510 and the cover 350.

In the present invention, Cu or Sn is used for the conductive member 510, and the thermal expansion coefficients of these are at a level of 14 to 16 ppm/° C. Meanwhile, the thermal expansion coefficient of the cover 350 formed of photosensitive resin is at a level of 50 to 80 ppm/° C. That is, when the cover 350 and the conductive layer 500 are formed of materials according to an embodiment of the present invention, there will be a difference of about three to six times between the thermal expansion coefficients. When a high temperature of a high pressure is applied to the acoustic wave device, a degree of expanding each of the configurations varies due to the difference of the thermal expansion coefficient described above. Accordingly, when the area of the conductive member 510 is determined without considering the difference of the thermal expansion coefficient, a twist or a crack may be generated on the cover 350, and warpage of the substrate 100 cannot be prevented as a result. Accordingly, in this embodiment, the area of the conductive member 510 on the cover 350 is determined considering the thermal expansion coefficient, and, for example, the area of the conductive member 510 is determined to be (thermal expansion coefficient of the conductive member 510/thermal expansion coefficient of the cover 350) times the area of the cover 350. Although the thermal expansion coefficient may vary according to the types of the materials forming the conductive member 510 and the cover 350, if the conductive member 510 is formed within a range as described above, the warpage, the crack and the like of the substrate 100 can be effectively prevented.

Hereinafter, another embodiment of the present invention will be described with reference to FIG. 5. FIG. 5 is a plan view showing an acoustic wave device according to another embodiment of the present invention.

In this embodiment, the connection terminal 400 includes at least one or more signal terminals 410 and at least two or more ground terminals 420. Two signal terminals 410 and two ground terminals 420 are shown in FIG. 5. However, this is only an example, and the number of the signal terminals 410 and the ground terminals 420 may vary according to the design of the acoustic wave device.

On the other hand, when a plurality of ground terminals 420 is formed in the acoustic wave device, at least two or more ground terminals 420 may be electrically connected to each other. If there are three ground terminals 420, two or all of the three ground terminals may be connected, and if there are four ground terminals 420, only two, two pairs, three or four ground terminals may be connected. When the ground terminals 420 are connected to each other like this, the signal processing characteristic can be improved.

Meanwhile, in an embodiment of the present invention, a metal line 430 for electrically connecting at least two or more ground terminals 420 may be formed on the top of the cover 350. FIG. 5 is a plan view showing an acoustic wave device including the metal line 430. When the ground terminals 420 are electrically connected by the metal line 430 formed on the top of the cover 350 as shown in this embodiment, the signal processing characteristic may be improved, and the metal line 430 itself may performs the function of the conductive member 510. The metal line 430 also demonstrates a function of enduring the pressure applied to the acoustic wave device. That is, the metal line 430 is a configuration for electrically connecting the ground terminals 420 from the aspect of improving the signal processing characteristic and, at the same time, a configuration for performing the function of the conductive member 510 from the aspect of improving the pressure resistance characteristic and durability.

Also in this embodiment, a space between a plurality of conductive members 510, a space between the connection terminal 400 and an adjacent conductive member 510, and a space between the metal line 430 and an adjacent conductive member 510 is set to be smaller than 60 um. In FIG. 5, all of $d_1$, $d_2$ and $d_3$ are smaller than 60 um.

Since it is described in the above embodiment that the pressure resistance characteristic and the durability are strengthened since the conductive members 510, the metal line 430 and the connection terminal 400 are densely and uniformly arranged on the top of the cover 350 by limiting the space between the conductive members 510, the space between the connection terminal 400 and an adjacent conductive member 510, and the space between the metal line 430 and an adjacent conductive member 510, this will not be described redundantly.

On the other hand, in an embodiment of the present invention, thickness of the conductive layer 500 is set to be 15 to 50 um. If thickness of the conductive layer 500 is smaller than 15 um, a pressure of 700 psi or higher generated in the transfer molding process or the like cannot be endured. On the other hand, if thermal conductivity is increased and the heat dissipation characteristic is improved by increasing thickness of the conductive layer 500, performance of the acoustic wave device can be improved. However, if thickness of the conductive layer 500 exceeds 50 um, there is a problem of intensifying warpage of the substrate 100. Accordingly, in this embodiment, thickness of the conductive layer 500 is set to be included within a range of the values described above.

In an embodiment of the present invention, the acoustic wave device further includes a protection layer 600 for covering the cover 350 and the conductive layer 500, and, therefore, the conductive layer 500 or the like can be effectively protected from foreign materials or the like of outside. When an SMT installation is performed on a PCB by putting solder on the connection terminal in a customer process, the solder may spread since the space between the conductive layers is narrow, and thus it is preferable to form the protection layer to prevent such a phenomenon. Meanwhile, the connection terminal may be electrically connected at the same time as the conductive layer is formed on the top of the cover in order to improve the characteristics between the ground signal terminals.

According to the present invention, the pressure resistance characteristic of an acoustic wave device can be improved, and, at the same time, warpage of a substrate can be prevented.

Furthermore, the signal transfer characteristic and the signal processing characteristic of the acoustic wave device can be improved.

In addition, since the manufacturing process of the acoustic wave device can be reduced, manufacturing cost can be saved, and manufacturing throughput can be enhanced.

In addition, it is advantageous in that a small and thin acoustic wave device can be provided.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An acoustic wave device comprising:
    a substrate;
    an IDT (InterDigital Transducer) arranged on the substrate;
    a connection electrode arranged on the substrate and electrically connected to the IDT;
    a side wall formed outside the IDT to create a cavity including the IDT on the substrate;
    a cover formed on a top of the side wall;
    a connection terminal penetrating the side wall or the cover or formed along, an inner or outer peripheral surface of the side wall, and electrically connected to the connection electrode; and
    a conductive layer formed on a top of the cover not to be overlapped with the connection terminal,
    wherein an area of a top surface of the conductive layer is less than 50% of an area of a top surface of the cover.

2. The device according to claim 1,
    wherein the conductive layer includes a plurality of conductive members, and
    wherein a total sum of areas of top surfaces of the conductive members is less than 50% of the area of the top surface of the cover.

3. The device according to claim 2,
    wherein the area of the top surface of each of the conductive members is less than 20% of the area of the top surface of the cover.

4. The device according to claim 2,
    wherein a space between the plurality of conductive members or a space between the connection terminal and an adjacent one of the conductive members is smaller than 60 um.

5. The device according to claim 1,
    wherein the conductive layer includes a plurality of conductive members, and
    wherein a total sum of areas of top surfaces of the conductive members is not greater than (a thermal expansion coefficient of the conductive members/a thermal expansion coefficient of the cover) times the area of the top surface of the cover.

6. The device according to claim 5,
    wherein the thermal expansion coefficient of the cover is three to six times the thermal expansion coefficient of the conductive layer.

7. The device according to claim 2,
    wherein the connection terminal includes at least one or more signal terminals and at least two or morel ground terminals, and
    wherein at least two or more of the ground terminals are electrically connected to each other.

8. The device according to claim 7,
    wherein a metal line for electrically connecting the at least two or more ground terminals is formed on the top of the cover.

9. The device according to claim 8,
    wherein a space between the plurality of conductive members, a space between the connection terminal and an adjacent one of the conductive members, or a space between the metal line and an adjacent one of the conductive members is smaller than 60 um.

10. The device according to claim 1,
    wherein a thickness of the conductive layer is 15 to 50 um.

11. The device according to claim 1,
    wherein the conductive layer and the connection terminal are electrically isolated from each other.

12. The device according to claim 1, further comprising a protection layer for covering the side wall, the cover and the conductive layer.

* * * * *